United States Patent
Wang et al.

(10) Patent No.: US 9,939,840 B2
(45) Date of Patent: Apr. 10, 2018

(54) ENHANCED STATUS MONITOR FOR SCAN TESTING

(71) Applicant: FREESCALE SEMICONDUCTOR, INC., Austin, TX (US)

(72) Inventors: Ling Wang, Suzhou (CN); Huangsheng Ding, Suzhou (CN); Wei Zhang, Suzhou (CN)

(73) Assignee: NXP USA, INC., Austin, TX (US)

( * ) Notice: Subject to any disclaimer, the term of this patent is extended or adjusted under 35 U.S.C. 154(b) by 74 days.

(21) Appl. No.: 14/850,965

(22) Filed: Sep. 11, 2015

(65) Prior Publication Data

US 2016/0238655 A1    Aug. 18, 2016

(30) Foreign Application Priority Data

Feb. 17, 2015    (CN) .......................... 2015 1 0208400

(51) Int. Cl.
  *G06F 1/10*    (2006.01)
  *G01R 31/3185*    (2006.01)
  *G06F 1/26*    (2006.01)

(52) U.S. Cl.
  CPC ....... *G06F 1/10* (2013.01); *G01R 31/318544* (2013.01); *G01R 31/318552* (2013.01)

(58) Field of Classification Search
  CPC .............. G06F 1/10; G01R 31/318544; G01R 31/31858; G01R 31/318594; G01R 31/318552

See application file for complete search history.

(56) References Cited

U.S. PATENT DOCUMENTS

| | | | | |
|---|---|---|---|---|
| 5,790,609 | A | * | 8/1998 | Swoboda ................ G06F 1/08 375/357 |
| 5,790,666 | A | * | 8/1998 | Ooi ........................ G06F 7/584 348/E5.108 |
| 6,232,796 | B1 | | 5/2001 | Batra |
| 6,421,812 | B1 | | 7/2002 | Wang |
| 6,519,230 | B1 | * | 2/2003 | Murayama ............... H04J 3/14 370/244 |
| 6,587,982 | B1 | * | 7/2003 | Lee ................. G01R 31/31724 714/733 |
| 6,809,664 | B1 | | 10/2004 | Pereira |

(Continued)

FOREIGN PATENT DOCUMENTS

CN    101387686    3/2009

OTHER PUBLICATIONS

Seuring, Markus; "An Introduction to Scan Testing for Engineers, Part 1 of 2".

(Continued)

*Primary Examiner* — April Y Blair
*Assistant Examiner* — Dipakkumar Gandhi
(74) *Attorney, Agent, or Firm* — Charles E. Bergere (57) ABSTRACT

An integrated circuit receives test-control information that is phase encoded on a scan clock used for testing a scan chain within the IC. The phase encoding does not affect the normal use of the scan clock and scan test chain and allows additional test-related data such as power supply, clock, and additional global and specialized status data to be collected by a secondary test data storage system such as a shift register. The phase encoding further controls selectively outputting the enhanced test status or the traditional scan test outputs.

16 Claims, 9 Drawing Sheets

(56) References Cited

U.S. PATENT DOCUMENTS

| | | | |
|---|---|---|---|
| 7,243,281 B2 | 7/2007 | Robertson | |
| 7,284,175 B2 | 10/2007 | Wang et al. | |
| 7,900,065 B2 | 3/2011 | Chase | |
| 2002/0118018 A1* | 8/2002 | Hasegawa | G11C 29/14 324/500 |
| 2003/0046622 A1* | 3/2003 | Whetsel | G01B 31/31858 714/724 |
| 2005/0028050 A1* | 2/2005 | Ganry | G01R 31/31725 714/700 |
| 2007/0168803 A1 | 7/2007 | Wang | |
| 2008/0278189 A1 | 11/2008 | Hur | |
| 2009/0154369 A1* | 6/2009 | Helvig | H04L 12/2801 370/252 |
| 2009/0240460 A1 | 9/2009 | Hur | |
| 2012/0019273 A1 | 1/2012 | Turner | |
| 2013/0102264 A1* | 4/2013 | Nakane | H03M 1/1004 455/130 |
| 2014/0047293 A1* | 2/2014 | Lamb | G01R 31/31855 714/727 |
| 2015/0048863 A1 | 2/2015 | Wang et al. | |

OTHER PUBLICATIONS

Seuring, Markus; "An Introduction to Scan Testing for Engineers, Part 2 of 2".
Anon, "XJDeveloper", www.xjtag.com, XJTAG-XDEV-DN-06.
Anon, "Design & Test Guidelines (version 4.0)", www.xjtag.com, xjtag 2013.

* cited by examiner

ENHANCED STATUS MONITOR FOR SCAN TESTING

BACKGROUND

The present invention relates generally to integrated circuit testing, and more particularly to a method of monitoring enhanced status during scan testing.

As the gate density of integrated circuits (ICs) increases, semiconductors are being manufactured today that have a much higher ratio of gate count to external package pin count. The result is that the test coverage of the circuits can be limited unless some additional package pins are dedicated to testing and additional testability is designed into the ICs.

Structured testing techniques that require dedicated test pins include Design For Testability (DFT) approaches such as scan testing, Built-In Self-Test (BIST), and Random Access Scan. However, because the number of external pins is limited, dedicated test pins are provided at the cost of reduced functionality and reduced normal run-time accessibility of functional modules of the circuit that would otherwise be possible using those pins.

Additionally, traditional scan tests are used to check for stuck-at faults, transistor faults, bridging faults, open faults, delay faults, and other types of faults, but do not concurrently capture other global or specialized status information of the chip that may be relevant to those failures.

Figure 1:
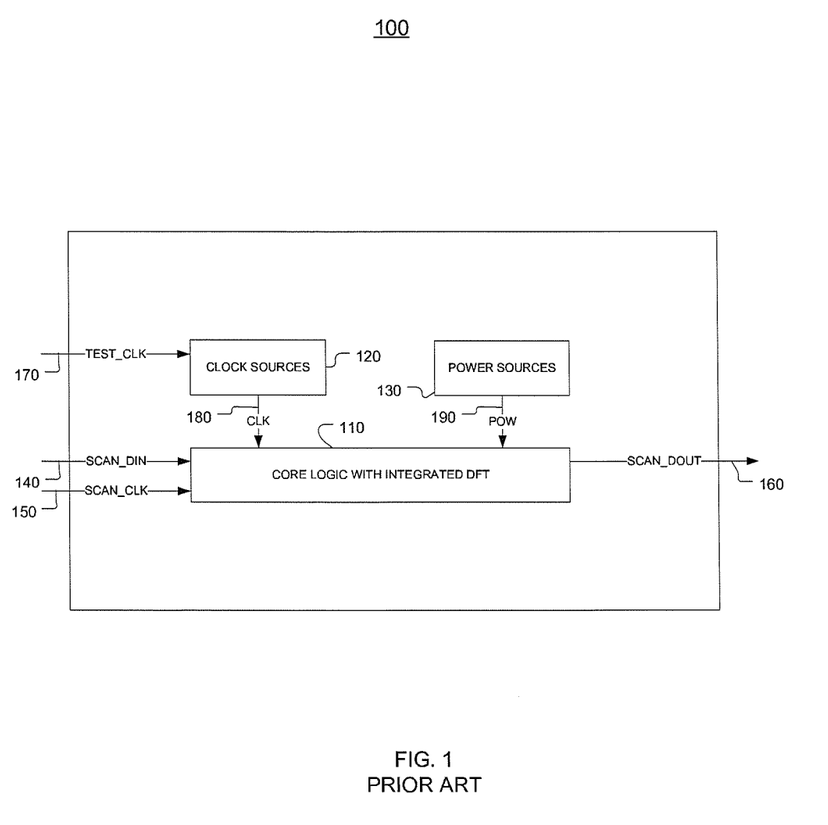
FIG. 1 is a block diagram illustrating a conventional IC that has been designed to support scan testing.

FIG. 1 is a simplified block diagram illustrating a conventional integrated circuit (IC) 100 that has been designed to support scan testing. The IC 100 includes a core logic block 110 with integrated Design For Test (DFT) circuitry, a clock source module 120, and a power source module 130.

The core logic block 110 receives inputs via the input data signal scan_din 140, which provide scan pattern inputs, and the clock signal scan_clk 150, which provides a clock for scanning scan test patterns into and out of the IC 100. The core logic block 110 outputs data via the output data signal scan_dout 160, as would be understood to one familiar with scan testing. Each of the above inputs, clocks, and outputs is associated with a pin on the IC package. Other inputs and outputs for functional operation of the core logic are not shown for purposes of clarity of this discussion.

The clock source module 120 includes an input clock signal test_clk 170 and generates a core logic clock signal clk 180 that connects to the core logic block 110. The clock source module 120 includes a crystal and PLL (phase locked loop) with divider (not shown) for generating the on-board clocks for the core logic block 110 to use during regular operation, and selector logic (not shown) for selectively allowing the core logic clock signal clk 180 to be driven directly by the input clock signal test_clk 170 under test conditions.

The power source module 130 is connected to power and ground connections (not shown) external to the IC 100 and generates the various voltages and currents used by the IC 100, specifically the core logic block 110, during operation and testing. The power source module 130 may also have bypass circuitry (not shown) for external provision of specific voltages to certain test points of the circuit during testing.

Note that the signals scan_din 140, scan_clk 150, scan_dout 160, and test_clk 170 require dedicated test pins that could otherwise be utilized in the IC 100 for direct functional I/O, power, and/or ground. In other words, the test inputs/outputs are using up valuable pins on the IC 100. Additionally, while the design of the IC 100 provides for monitoring typical scan test faults, it fails to provide a mechanism for monitoring other status information associated with the state of the IC 100 that may be relevant to the failures being detected via scan test or otherwise.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION OF THE INVENTION

Detailed illustrative embodiments of the present invention are disclosed herein. However, specific structural and functional details disclosed herein are merely representative for purposes of describing example embodiments of the present invention. The present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment of the invention, an integrated circuit comprises core logic and an enhanced status monitor. The core logic has integrated scan-test hardware that performs scan testing on the core logic based on a scan clock and a scan data input signal to generate a scan data output signal. The enhanced status monitor receives the scan clock and a test clock, wherein the scan clock has been phase encoded with test-control information. The enhanced status monitor (i) decodes the phase-encoded scan clock relative to the test clock to recover the test-control information and (ii) uses the test-control information to selectively store enhanced test status data.

In another embodiment, the invention provides a method for enhanced test status monitoring within an integrated circuit. Phase-encoded test-control information is decoded from a scan clock and a test clock, the scan clock otherwise dedicated to scan-test hardware associated with core logic within the IC. The test-control information is used to direct selectively storing enhanced test status data used in the enhanced test status monitoring.

Figure 2:
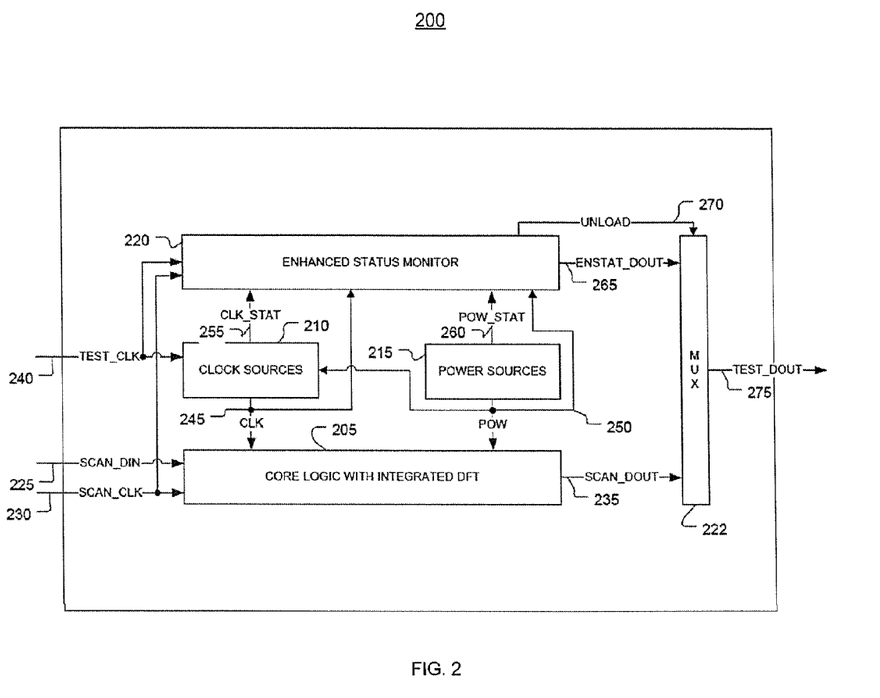
FIG. 2 is a simplified block diagram illustrating an integrated circuit that has been designed to support scan testing according to an embodiment of the present invention.

Referring now to FIG. 2, a simplified block diagram illustrating an integrated circuit (IC) 200 that has been designed to support testing according to an embodiment of the present invention is shown. The IC 200 includes a core logic module 205 with integrated DFT circuitry, a clock sources module 210, a power sources module 215, an enhanced status monitor module 220, and a multiplexer (mux) 222.

The core logic module 205, which represents the bulk of the circuitry within the IC 200, receives inputs via data signal scan_din 225 and clock signal scan_clk 230, and outputs data via data signal scan_dout 235. The signal scan_din 225 provides a serial scan test pattern for loading into the core logic module 205 one bit at a time (e.g., on each rising edge of the clock signal scan_clk 230) during a scan test load cycle to preset inputs to combinatorial and sequential logic (not shown) within the core logic module 205. The load cycle is typically followed by an execution cycle, where the clock signal test_clk 240 or the onboard clock of the system is allowed to advance a few cycles before being halted. Next, during an unload cycle, the output signal scan_dout 235 carries a serial sequence of bits shifted out by the clock signal scan_clk 230, which bits represent results of the scan test. Other inputs and outputs for functional operation of the core logic module 105 are not shown for purposes of clarity of this discussion.

The clock sources module 210 includes the clock signal test_clk 240 and generates the core logic clock signal clk 245, the latter output which it drives to the core logic module 205. The clock sources module 210 includes (i) a crystal and PLL with divider (not shown) for generating the on-board clocks for the core logic block 205 to use during regular operation and (ii) selector logic (not shown) for selectively allowing the core logic clock signal clk 245 to be driven directly by the clock signal test_clk 240 under test conditions. The clock sources module 210 also includes the output signal clk_stat 255 representing the status of the PLL or other circuitry within the clock sources module 210. The output signal clk_stat 255 might include an indicator such as "locked," "running," or other indicator of interest for enhanced test monitoring. In some embodiments, the output signal clk_stat 255 might be carried on a single wire or a bus.

The power sources module 215, which is connected to power and ground connections (not shown) external to the IC 200, conditions the external voltages and generates the various voltages and currents used by the circuitry of the various modules within the IC 200 during operation and testing. These voltages and currents are represented by the signal pow 250 output from the power sources module 215 and input to the core logic module 205, the clock sources module 210, and the enhanced status monitor module 220.

The power sources module 215 might also contain bypass circuitry (not shown) to allow a testing apparatus to provide specific voltages to certain test points of the IC 200 directly during testing (not shown). The power sources module 215 also includes the output signal pow_stat 260 representing enhanced status of the voltage generation circuitry. The output signal pow_stat 260 might include a short circuit indicator, an over/undervoltage indicator, and/or other information useful in debugging power supply issues. The output signal pow_stat 260 might be carried on a single wire or a bus.

The enhanced status monitor module 220 receives a copy of the clock signal scan_clk 230 as an input along with a copy of the clock signal test_clk 240 and a copy of the system clock via the signal clk 245, as well as power via the input pow 250. It also receives the signal clk_stat 255 and the signal pow_stat 260. The enhanced status monitor module 220 outputs an enhanced status data output signal enstat_dout 265 and an unload control signal 270.

The mux 220 selects between driving the output signal test_dout 275 with the output signal enstat_dout 265 of the enhanced status monitor module 220, or the output signal scan_dout 235 of the core logic module 205. The mux 220 is controlled by the unload control signal 270 from the enhanced status monitor module 220.

During testing, a traditional scan test is performed within the core logic module 205 using the input signals scan_din 225 and scan_clk 230. The results of this scan test are output via the signal scan_dout 235 to the mux 222 and from there via the signal test_dout 275 when the mux 222 is appropriately configured for scan test output (i.e., when the unload control signal 270 is not asserted. However, concurrently with the scan test, the enhanced status monitor module 220 collects data associated with global and other specialty status events which are not captured as part of the scan test and which may be used to improve a test engineer's understanding of any potential faults he detects using the scan test. Under the control of the unload control signal 270, either the scan test data or the enhanced status monitor status data is output from the IC 200 via the output signal test_dout 275.

The traditional scan test within the core logic module 205 is mechanized in a traditional manner using the input signals scan_din 225 and scan_clk 230 as would be understood by one skilled in the art. However, in the IC 200, the enhanced status monitoring capability is facilitated by phase modulations of the otherwise traditional input clock signal scan_clk 230, which is also an input to the enhanced status monitoring module 220. These phase modulations are made with respect to the input clock signal test_clk 240, which is additionally input to the enhanced status monitor module 220.

The modulations of the input clock signal scan_clk 230 are ignored by the traditional scan test logic within the core logic module 205, since those modulations represent a small amount of jitter on the scan clock that does not affect the scan pattern loading and unloading operations. However, advantageously, these modulations allow commands to be encoded and passed to the enhanced status monitor module 220 without the need for the use of an additional dedicated test pin on the IC 200.

Figure 3A:
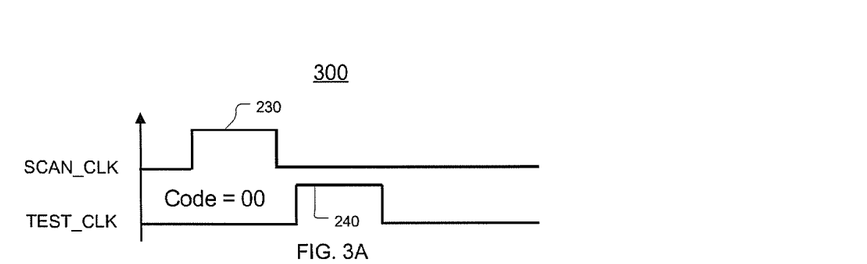
FIGS. 3A to 3D are timing diagrams illustrating a phase modulation scheme in accordance with an embodiment of the present invention.

FIGS. 3A to 3D are timing diagrams illustrating a phase modulation scheme in accordance with an embodiment of the present invention. In FIG. 3A, the clock signal scan_clk 230 is shown rising and falling before the rising edge of the clock signal test_clk 240. This phase relationship is assigned the two-bit symbol code '00b'.

Figure 3B:
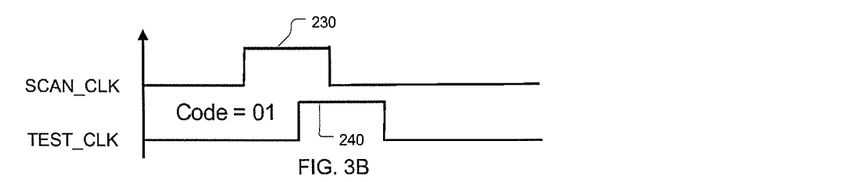

In FIG. 3B, the clock signal scan_clk 230 is shown rising before but falling after the rising edge of the clock signal test_clk 240. This phase relationship is assigned the two-bit code '01b'.

Figure 3C:
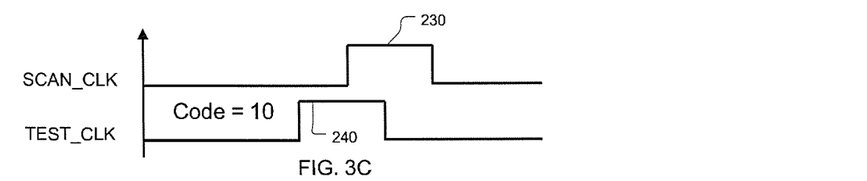

In FIG. 3C, the clock signal scan_clk 230 is shown rising after the rising edge of the clock signal test_clk 240 and falling after the falling edge of clock signal test_clk 240. This phase relationship is assigned the two-bit code '10b'.

Figure 3D:
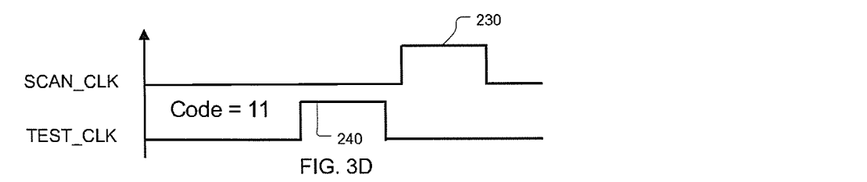

In FIG. 3D, the clock signal scan_clk 230 is shown rising and falling after the falling edge of the clock signal test_clk 240. This phase relationship is assigned the two-bit code '11b'.

Figure 4:
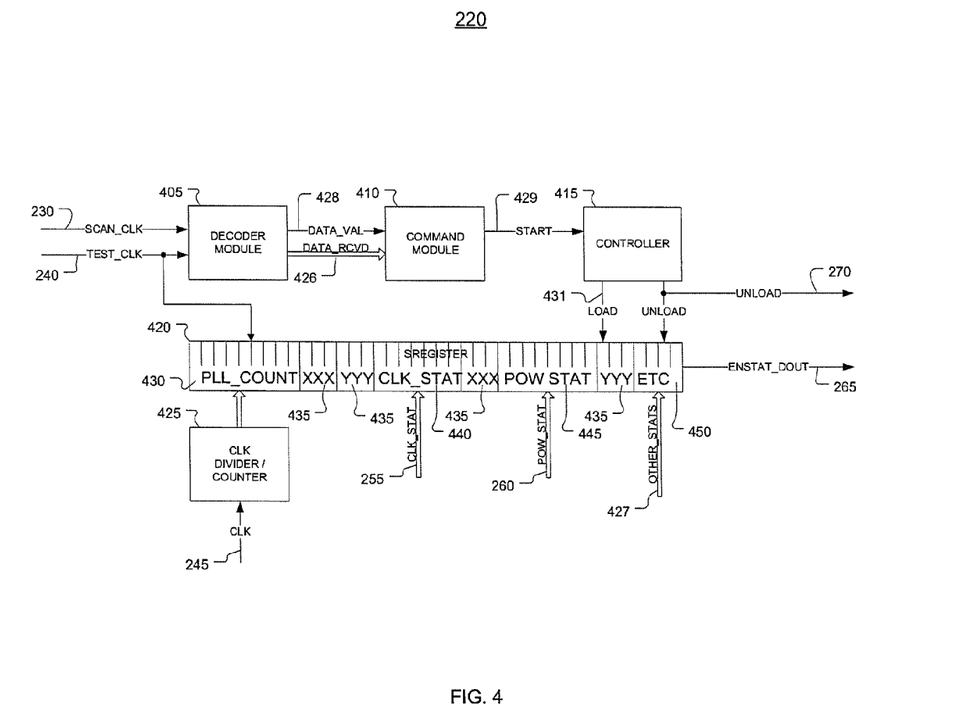
FIG. 4 is a simplified block diagram of an enhanced status monitor according to an embodiment of the present invention.

FIG. 4 is a simplified block diagram of the enhanced status monitor module 220 of FIG. 2 according to an embodiment of the present invention. The module 220 includes a decoder module 405, a command module 410, a controller module 415, a shift register 420, and a clock divider/counter module 425.

The decoder module 405 receives the clock signals scan_clk 230 and test_clk 240, and decodes information that has been phase-encoded on the clock signal scan_clk 230 to produce a two-bit symbol for each pulse of the clock on the clock signal test_clk 240 that meets the requirements of the phase encoding timing of FIG. 3. The decoder module 405 outputs the decoded symbol on the two-bit wide bus data_rcvd 426 to the command module 410 and, at the same time, asserts the signal data_val 428 to the command module 410 if the symbol on the bus data_rcvd 426 is valid.

The command module 410 receives the symbol from the bus data_rcvd 426, performs a two-bit parallel-to-serial conversion, and stores the result in a 4-bit serial circular buffer (not shown) internal to the command module 410. In various embodiments, the circular buffer may be any reasonable length, e.g., from 4 bits to 128 bits or more.

Within the command module 410, there is a 4-bit wide by eight locations deep command buffer, with each of up to eight of the locations pre-loaded (e.g., during power-on reset) with one of the 2^4=16 commands possible with the 4-bit code. In various embodiments, there may be more or fewer locations within the command buffer, and each 4-bit command might represent a match tag for a longer associated instruction code.

During testing, the circular buffer value is compared with each of the commands in the command buffer. If there is a match between the contents of the circular buffer and one of the commands in the command buffer, then the start signal 429 is asserted from the command module 410 to the controller module 415, indicating that a valid command for enhanced status has been requested by the tester.

If the type of the command indicates that a sequence of events should be executed to prepare the enhanced status for capture, the command module 410 will first oversee the completion of that sequence before asserting the start signal 429. For example, if the command indicates a memory built-in self test is to be run, and the results are to be reported as part of the enhanced status, the command module 410 may initiate the self-test and wait for the results to be queued to the register sregister 420 (e.g., via the parallel input other_stats 427) before asserting the start signal 429 to the controller module 415. As another example, a command might indicate a particular divide-down ratio is to be used by the clk divider/counter 425. In this case, the command module 410 may wait a predetermined number of cycles of the clock signal test_clk 240 until the counting operation of the clk divider/counter 425 is complete before asserting the start signal 429.

The controller module 415 receives the start signal 429 from the command module 410 and, if the start signal 429 is asserted, then the controller module 415 initiates a parallel load of enhanced status (e.g., clock and power status) into the sregister 420, followed by a serial unload from the sregister 420 using the load and unload signals 431 and 270.

In various embodiments, the sregister 420 might have both parallel and serial load capabilities depending on the source of the enhanced status being reported. For example, in some embodiments, one or more of the signals clk_stat 255, pow_stat 260, and other_stats 427 might be a serial input, carrying the result of an alternative or auxiliary scan test serially to the sregister 420.

In the implementation of FIG. 4, however, the sregister 420 is a parallel-loaded and serially-unloaded 40-bit shift register. The sregister 420 receives parallel inputs from the clk divider/counter module 425, and from the parallel inputs clk_stat 255, pow_stat 260, and other_stats 427. Following the assertion of the load signal 431 from the controller module 415, the sregister 420 loads its inputs into corresponding internal locations.

The location 430 is 9 bits wide and stores a phase locked loop count value. The location 440 is 7 bits wide and stores enhanced clock status. The location 445 is 8 bits wide and stores power status information, and the location 450 is 4 bits wide and is used to store other status information as may be requested from time to time as a function of the command loaded via the modulation of the scan clock signal received via the clock signal scan_clk 230. The locations 435 labeled "XXX" and "YYY" might contain checksum, error correction code, prefix, postfix, sync, preamble, or other bits as needed to ensure proper communication or separation of enhanced status fields as necessary.

In various embodiments, the bit allocation of the sregister 420 will be different from that shown in FIG. 4, including, for example, more or fewer bit locations overall and more or fewer bits per type of status.

When the load signal 431 is asserted to the sregister 420, the sregister 420 does a parallel load from the signals presented to it via its various parallel inputs. For example, upon assertion of the load signal 431, clock status presented at its parallel input from the bus clk_stat 255 will be loaded into the corresponding clk_stat sregister location 440.

When the unload signal 270 is asserted to the sregister 420, the sregister 420 shifts its contents out serially via the output signal enstat_dout 265. Given that unload also controls the mux 222 illustrated in FIG. 2, the data out of the sregister 420 is thus made available at the output of the IC 200 via the output signal test_dout 275 in place of the serial scan data output via the output signal scan_dout 235 from the core logic module 205.

Figure 5:
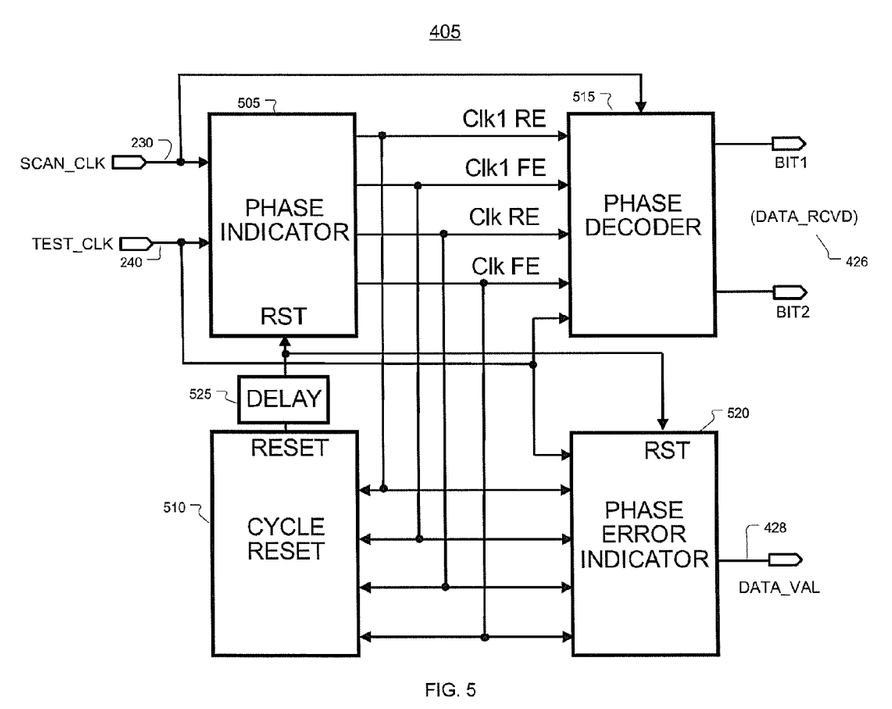
FIG. 5 is a schematic circuit diagram of a decoder module according to an embodiment of the present invention.

FIG. 5 is a schematic circuit diagram of the decoder module 405 of FIG. 4 in accordance with an embodiment of the present invention. The decoder module 405 includes a phase indicator module 505 having two inputs coupled respectively to the test_clk input 240 and the scan_clk input 230. The phase indicator 505 also has a reset input (RST) and four timing information outputs (TI) which are: a reference pulse input rising edge indicator output (Clk RE); a reference pulse input falling edge indicator output (Clk FE); a data pulse input rising edge indicator output (Clk1 RE); and a data pulse input falling edge indicator output (Clk1 FE).

The timing information outputs (TI) of the phase indicator module 505 are coupled to inputs of a cycle reset module 510, a phase decoder module 515, and a phase error indicator module 520. Furthermore, the test_clk input 240 is coupled to inputs of the phase decoder module 515 and the phase error indicator module 520, and the scan_clk input 230 is coupled to an input of the phase decoder module 515. The cycle reset module 510 has a RESET output coupled through a delay 525 to the reset inputs (RST) of the phase indicator module 505 and a phase error indicator module 520. The phase decoder module 515 has two outputs providing two of the decoded binary data outputs (BIT1 and BIT2) that comprise the data_rcvd signal 426, and the phase error indicator module 520 has a single valid phase pulse sequence signal output (data_val 428). As will be discussed later, not all the inputs to the phase decoder module 515 are required, and the actual inputs are dependent on the specific embodiment or implementation of the phase decoder module 515.

Figure 6:
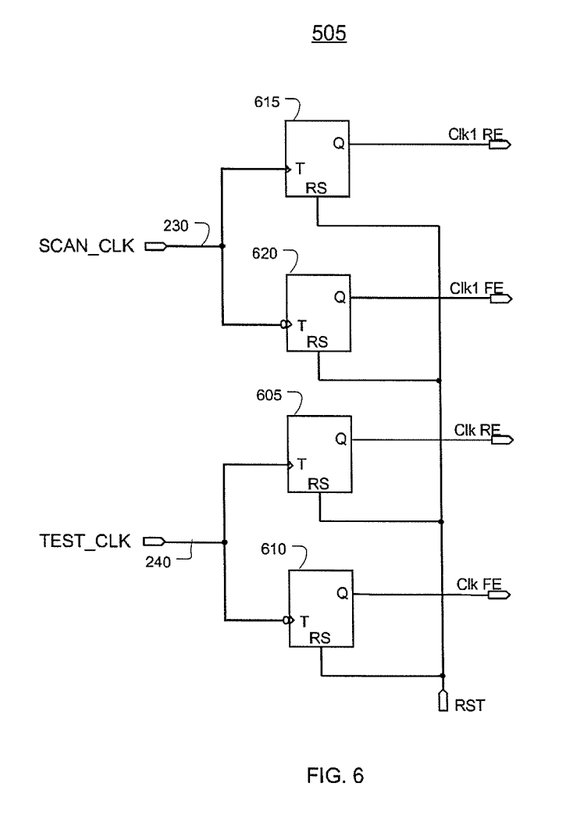
FIG. 6 is a schematic circuit diagram of a phase indicator module according to an embodiment of the present invention.

FIG. 6 is a schematic circuit diagram of the phase indicator module 505 of FIG. 5 in accordance with an embodiment of the present invention. The phase indicator module 505 includes pairs of complementary latches, each pair being selectively coupled to one of the phase inputs (scan_clk 230 and test_clk 240). These latches include a reference-pulse rising-edge-triggered T-type flip-flop 605 and a reference-pulse falling-edge-triggered T-type flip-flop 610. Both flip-flops 605 and 610 have a T input coupled to the reference-pulse input (test_clk 240) and their reset inputs (RS) coupled to the reset input (RST) of the phase indicator module 505. Also, an output Q of the flip-flop 605 provides the reference-pulse input rising edge indicator output (Clk RE), and an output Q of the flip-flop 610 provides the reference-pulse input falling edge indicator output (Clk FE).

The phase indicator module 505 further includes latches in the form of a data-pulse rising-edge-triggered T-type flip-flop 615 and a data-pulse falling-edge-triggered T-type flip-flop 620. Both flip-flops 615 and 620 have a T input coupled to the data-pulse input (scan_clk 230) and their reset inputs (RS) coupled to the reset input (RST) of the phase indicator module 505. Also, an output Q of the flip-flop 615 provides the data-pulse input rising edge indicator output (Clk1 RE), and an output Q of the flip-flop 620 provides the data input pulse falling edge indicator output (Clk1 FE).

Figure 7:
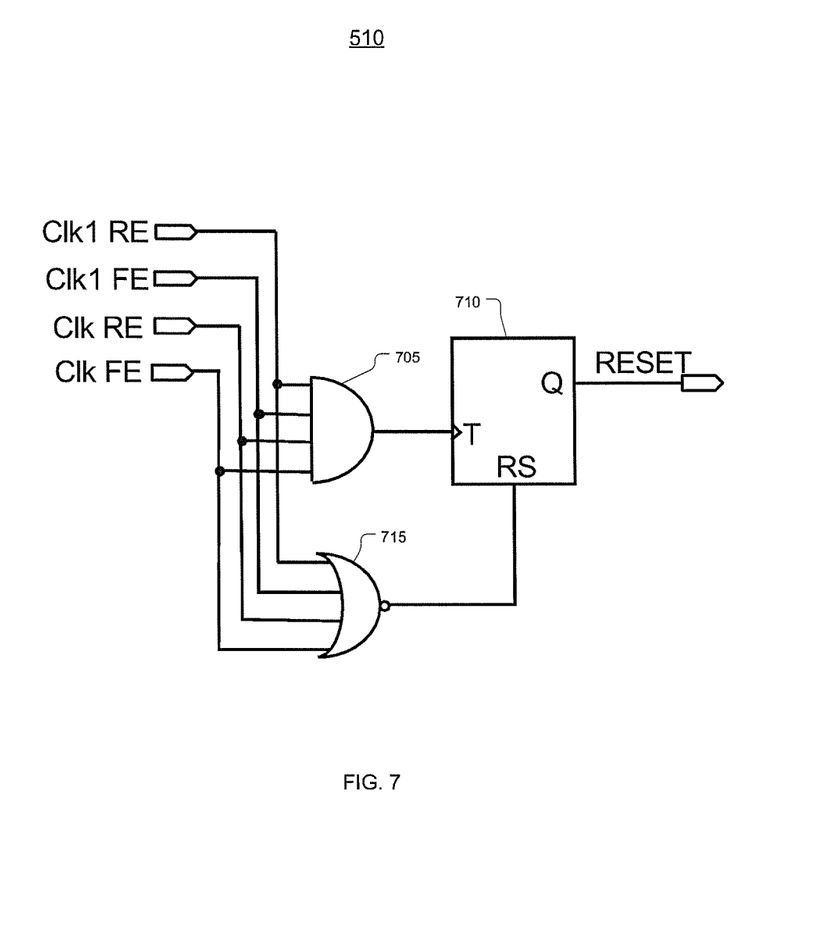
FIG. 7 is a schematic circuit diagram of a cycle reset module according to an embodiment of the present invention.

FIG. 7 is a schematic circuit diagram of the cycle reset module 510 of FIG. 5 in accordance with an embodiment of the present invention. The cycle reset module 510 includes a four-input AND gate 705 with an output coupled to a T input of a T-type flip-flop 710. There is also a four-input NOR gate 715 with an output coupled to a reset input RS of the T-type flip-flop 710. An output Q of the T-type flip-flop 710 provides the RESET output of the cycle reset module 510. Furthermore, the inputs of the AND gate 705 and NOR gate 715 are coupled to the timing information outputs (TI) of the phase indicator module 505.

Referring back to FIG. 5, the phase decoder module 515 can be implemented in many different ways and need not have all the inputs as illustrated. In one embodiment, the phase decoder module 515 is a programmable processor-based architecture that processes the logic values at the timing information outputs in response to detection of the leading and trailing pulse edges on one of the phase inputs (e.g., scan_clk 230 and test_clk 240). The phase decoder module 515 is programmed to perform the below waveform analysis of the timing information outputs (TI).

```
When Test Clk = rising edge then
CASE (Clk1 RE, Clk1 FE)
0,0 : data1 = (11 OR 10);
1,0 :data1 = 01;
1,1 :data1 = 00
END CASE
```

```
When Test Clk = falling edge then
CASE (Clk1 RE, Clk1 FE)
0,0 AND data1 = (11 OR 10): BIT1,BIT2 = 1,1;
1,0 AND data1 = (11 OR 10): BIT1,BIT2 = 1,0;
1,1 AND data1 = 01; : BIT1,BIT2 = 0,1;
1,1 AND data1 = 00; BIT1,BIT2 = 0,0;
END CASE
```

The previous waveform analysis illustrates that the two decoded binary data outputs (BIT1 and BIT2) are determined by comparing arrival timing information of the reference pulse (CLK RE) and arrival timing information of the data pulse (scan_clk 230). More specifically, the data outputs (BIT1 and BIT2) are determined by comparing timing information of rising and falling edges of the reference pulse 240 (test_clk) with the rising and falling edges indicated by Clk1 RE and Clk1 FE. It should be noted however that just the four timing information outputs (Clk RE and Clk FE, Clk1 RE and Clk1 FE) can be used in the above waveform analysis since Clk RE and Clk FE are indicative of the rising and falling edges of the reference pulse 240 (test_clk). Similarly, other waveform analysis processes can be used by comparing the Clk RE and Clk FE inputs with rising and falling edges of the data pulse 230 (scan_clk).

Figure 8:
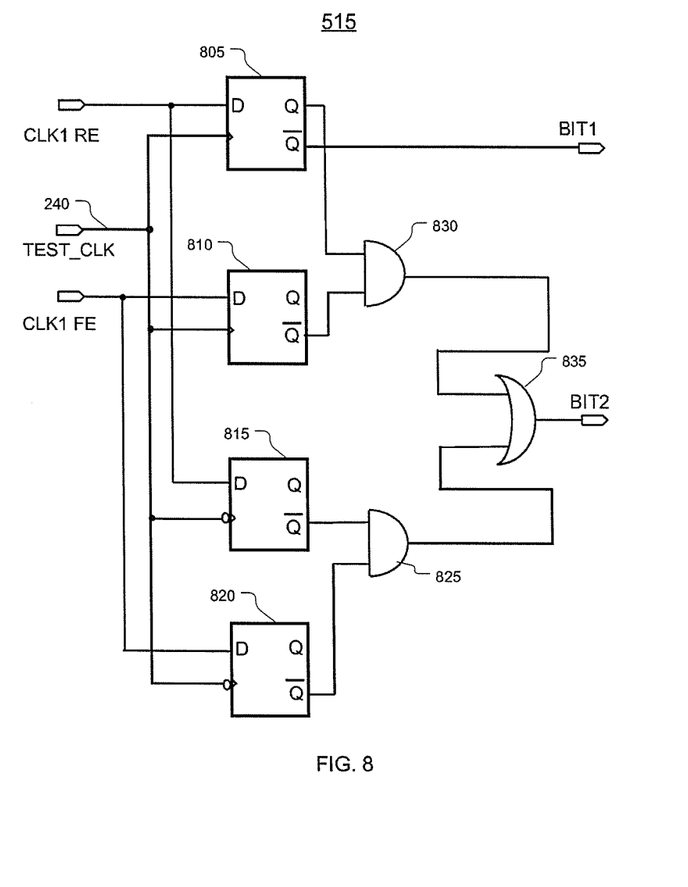
FIG. 8 is a schematic diagram of a phase decoder module according to an embodiment of the present invention.

In another embodiment, the phase decoder module 515 can be a latch-based architecture as shown in FIG. 8, which is a schematic diagram of the phase decoder module 515 according to another embodiment of the present invention. The phase decoder module 515 includes (i) a rising-edge-triggered D-type flip-flop 805 with a D input coupled to the data-pulse input rising-edge indicator output (Clk1 RE) and (ii) a rising-edge-triggered clock input coupled to the reference input (test_clk 240). A Qbar output of the flip-flop 805 provides the decoded binary data output BIT1. There is also (i) a further rising-edge-triggered D-type flip-flop 810 with a D input coupled to the data-pulse falling-edge indicator output (Clk1 FE) and (ii) a rising-edge-triggered clock input coupled to the reference input (test_clk 240).

The phase decoder module 515 also includes two falling-edge-triggered D-type flip-flops 815 and 820. A D input of the flip-flop 815 is coupled to the data-pulse input rising-edge indicator output (Clk1 RE), and the D input of input of the flip-flop 820 is coupled to the data-pulse input falling-edge indicator output (Clk1 FE). The edge-triggered clock inputs of both flip-flops 810 and 815 are also coupled to the reference pulse input (test_clk 240). The Qbar outputs of both flip-flops 815 and 820 are coupled to inputs of an AND gate 825. Also, the Q output of the flip-flop 805 and Qbar output of the flip-flop 810 are coupled to inputs of an AND gate 830. Outputs of both AND gates 825 and 830 are coupled to inputs of an OR gate 835 which has an output providing the decoded binary data output BIT2.

Figure 9:
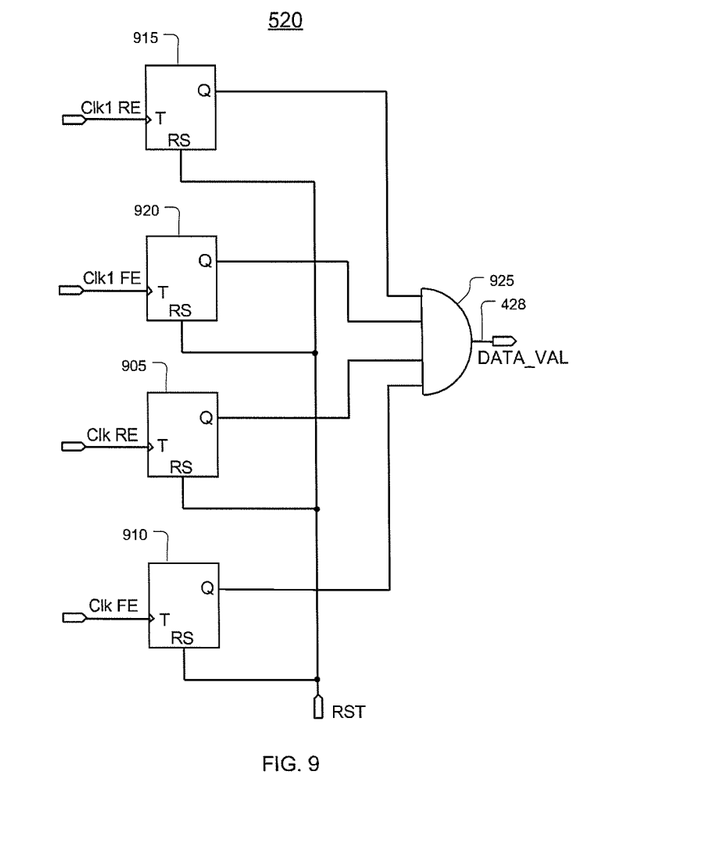
FIG. 9 is a schematic circuit diagram of a phase error indicator module according to an embodiment of the present invention.

FIG. 9 is a schematic circuit diagram of the phase error indicator module 520 of FIG. 5 in accordance with an embodiment of the present invention. The phase error indicator module 520 includes four rising-edge-triggered T-type flip-flops 905, 910, 915, and 920, each having a T input respectively coupled to one of the timing information outputs (TI), which are: the reference-pulse input rising-edge indicator output (Clk RE); the reference-pulse input falling-edge indicator output (Clk FE); the data-pulse input rising-edge indicator output (Clk1 RE); and the data-pulse input falling-edge indicator output (Clk1 FE).

The reset inputs (RS) of the flip-flops 905, 910, 915, and 920 are coupled to the reset input (RST) of the phase indicator module 505, and their Q outputs are coupled to inputs of an AND gate 925. An output of the AND gate 925 provides the data_val output 428 for the phase error indicator module 520.

Unless stated otherwise, terms such as "first," "second," and "third" are used to arbitrarily distinguish between the elements such terms describe. Thus, these terms are not necessarily intended to indicate temporal or other prioritization of such elements and are not to be interpreted as necessarily referencing similarly numbered elements in the embodiments of the specification. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. An integrated circuit (IC), comprising:
   core logic;
   scan test hardware integrated with the core logic for performing scan testing on the core logic based on a scan clock and a scan data input signal to generate a scan data output signal, wherein the scan clock is phase encoded with test-control information; and
   a status monitor that receives the scan clock and a test clock, wherein the status monitor (i) decodes the phase-encoded scan clock relative to the test clock to recover the test-control information and (ii) uses the test-control information to selectively store test status data,
   wherein the status monitor comprises:
      a decoder that decodes the phase-encoded scan clock to recover received data and a data valid signal;
      a command module coupled to the decoder module for receiving the recovered received data and the data valid signal; and
      a comparator that compares the received data, when valid, with pre-stored commands, wherein a match of valid received data with the pre-stored commands results in generation of the test-control information;
      a multiplexer having a first input coupled to a test status data output of the status monitor and a second input coupled to the scan data output signal, wherein at least part of the test-control information is used to select between the first and second multiplexer inputs to drive a data output of the IC with one of the scan data output signal and the test status data output of the test status monitor.

2. The IC of claim 1, wherein the status monitor comprises a shift register for selectively storing the test status data.

3. The IC of claim 1, wherein the test status data includes status of a phase locked loop within the IC.

4. The IC of claim 1, wherein the test status data includes status of a power source within the IC.

5. The IC of claim 1, wherein the test status data includes a characteristic of a clock source within the IC.

6. The IC of claim 1, wherein the test status data includes results of a built-in-self-test within the IC.

7. The IC of claim 1, wherein the phase encoding of the test-control information on the scan clock does not substantively affect the operation of the scan-test hardware, such that the scan-test hardware can operate concurrently with the status monitor.

8. The IC of claim 1, wherein the decoder module comprises:
   a phase indicator module having inputs coupled to the test clock and the scan clock, wherein the phase indicator module has timing information outputs that provide logic values indicative of rising and falling edges of pulses occurring on the test clock and the scan clock; and
   a phase decoder module having inputs coupled to the timing information outputs, wherein the phase decoder module compares at least two of the logic values at the timing information outputs with signals representative of leading and trailing edges of a pulse applied to one of the test clock and scan clock inputs to determine a pulse arrival order sequence between signals on the scan clock and the test clock inputs.

9. A method for test status monitoring within an integrated circuit (IC), comprising:
   decoding phase-encoded test-control information from a scan clock and a test clock, the scan clock otherwise dedicated to scan-test hardware associated with core logic within the IC; and
   using the test-control information to direct selectively storing test status data used in the test status monitoring,
   wherein the test status monitoring comprises:
      decoding the phase encoded test-control information from the scan clock and the test clock to produce received data and a data valid signal; and
      comparing the received data, when valid, with pre-stored commands, wherein a match of valid received data with the pre-stored commands results in generation of the test-control information;
   wherein the test-control information is used to select between at least two multiplexer inputs to drive a data output of the IC with either a scan data output signal from the scan-test hardware or the stored test status data.

10. The method of claim 9, wherein a shift register is used for the storing the test status data.

11. The method of claim 9, wherein the test status data includes status of a phase locked loop within the IC.

12. The method of claim 9, wherein the test status data includes status of a power source within the IC.

13. The method of claim 9, wherein the test status data includes a characteristic of a clock source within the IC.

14. The method of claim 9, wherein the test status data includes results of a built-in-self-test within the IC.

15. The method of claim 9, wherein the phase encoding of the test-control information on the scan clock does not substantively affect the operation of the scan-test hardware such that the scan test hardware can operate concurrently with the status monitoring.

16. The method of claim 9, further comprising comparing arrival times of rising and falling edges of the scan clock and the test clock to determine a phase relationship between the scan clock and the test clock, and decoding the phase relationship to a value used in the generation of the test-control information.

* * * * *